United States Patent
Benson et al.

(10) Patent No.: US 10,411,142 B2
(45) Date of Patent: Sep. 10, 2019

(54) METHOD FOR PRODUCTION OF COMPONENTS COMPRISING A SCHOTTKY DIODE BY MEANS OF PRINTING TECHNOLOGY

(71) Applicant: UNIVERSITAT DUISBURG-ESSEN, Essen (DE)

(72) Inventors: Niels Benson, Duisburg (DE); Roland Schmechel, Darmstadt (DE); Marc Hoffmann, Dinslaken (DE); Thomas Kaiser, Duisburg (DE); Daniel Erni, Duisburg (DE)

(73) Assignee: UNIVERSITY DUISBURG-ESSEN (DE)

( * ) Notice: Subject to any disclaimer, the term of this patent is extended or adjusted under 35 U.S.C. 154(b) by 0 days.

(21) Appl. No.: 15/560,544

(22) PCT Filed: Mar. 23, 2016

(86) PCT No.: PCT/EP2016/056315
§ 371 (c)(1),
(2) Date: Sep. 22, 2017

(87) PCT Pub. No.: WO2016/150988
PCT Pub. Date: Sep. 29, 2016

(65) Prior Publication Data
US 2018/0114867 A1    Apr. 26, 2018

(30) Foreign Application Priority Data
Mar. 23, 2015 (DE) .................. 10 2015 205 230

(51) Int. Cl.
*H01L 29/20* (2006.01)
*H01L 29/872* (2006.01)
(Continued)

(52) U.S. Cl.
CPC ...... *H01L 29/872* (2013.01); *H01L 21/02532* (2013.01); *H01L 21/02538* (2013.01);
(Continued)

(58) Field of Classification Search
None
See application file for complete search history.

(56) References Cited

U.S. PATENT DOCUMENTS 9,305,766 B2 * 4/2016 Samuelson ............ B82Y 10/00
2005/0235869 A1 * 10/2005 Cruchon-Dupeyrat ......................
B82Y 10/00
106/31.29

(Continued)

FOREIGN PATENT DOCUMENTS

DE    10 2011 122091 A1    6/2013

OTHER PUBLICATIONS

International Search Report prepared by the European Patent Office dated Jun. 3, 2016, for International Application No. PCT/EP2016/056315.

(Continued)

*Primary Examiner* — Michael Lebentritt
(74) *Attorney, Agent, or Firm* — Sheridan Ross P.C.

(57) ABSTRACT

The invention concerns a method for production of components comprising a Schottky diode by means of printing technology. The method involves a step of application and deposition of a semiconductor-nanoparticle dispersion on a first electrode, which is disposed on a substrate, the step of exposure to laser light of the deposited semiconductor-nanoparticle dispersion to form a mu-cone with a bottom and a tip, wherein the bottom of the mu-cone is joined to the first electrode, the step of embedding the thus-formed mu-cone in an electrically insulating polymer matrix, and the (Continued)

Figure 1:
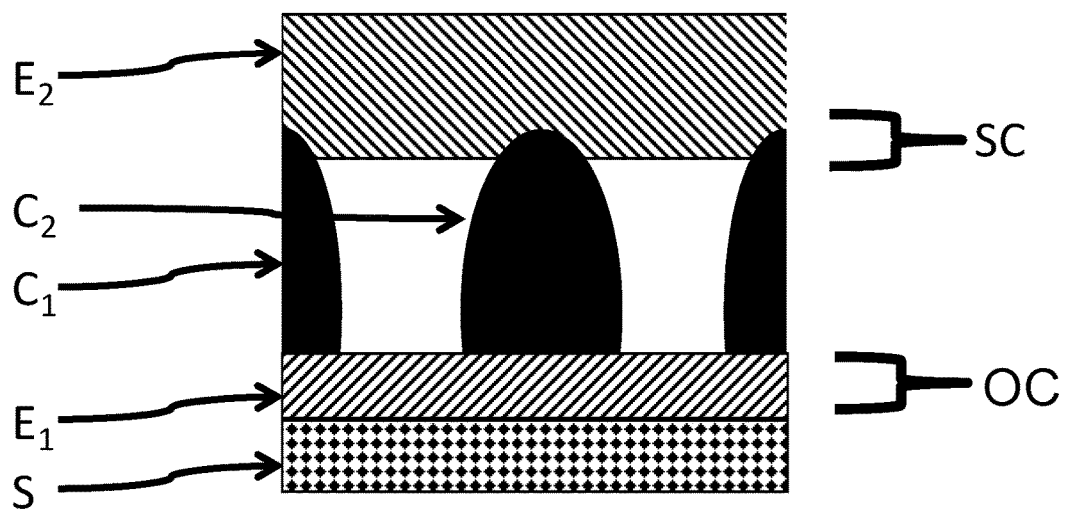

step of applying a second electrode, so that the tip of the mu-cone is joined to the second electrode.

9 Claims, 3 Drawing Sheets

(51) Int. Cl.
  *H01L 21/268* (2006.01)
  *H01L 29/66* (2006.01)
  *H01L 29/06* (2006.01)
  *H01L 21/02* (2006.01)
  *H01L 29/16* (2006.01)

(52) U.S. Cl.
  CPC .. *H01L 21/02623* (2013.01); *H01L 21/02664* (2013.01); *H01L 21/268* (2013.01); *H01L 29/0649* (2013.01); *H01L 29/0657* (2013.01); *H01L 29/16* (2013.01); *H01L 29/20* (2013.01); *H01L 29/66143* (2013.01); *H01L 29/66212* (2013.01); *H01L 29/66969* (2013.01)

(56) References Cited

U.S. PATENT DOCUMENTS

| | | | | |
|---|---|---|---|---|
| 2006/0103060 | A1* | 5/2006 | Kawakami | B01J 19/0013 266/202 |
| 2007/0128905 | A1* | 6/2007 | Speakman | H05K 1/0265 439/161 |
| 2008/0280104 | A1* | 11/2008 | Komori | B82Y 30/00 428/149 |
| 2008/0286488 | A1* | 11/2008 | Li | B22F 1/0074 427/541 |
| 2010/0321044 | A1* | 12/2010 | Sheu | B82Y 10/00 324/691 |
| 2011/0056543 | A1* | 3/2011 | Ackermann | H01L 51/0068 136/255 |
| 2013/0234160 | A1 | 9/2013 | Matsuno | |
| 2014/0175372 | A1* | 6/2014 | berg | H01L 31/022466 257/9 |
| 2015/0093516 | A1* | 4/2015 | Araga | B05C 9/12 427/542 |
| 2015/0382476 | A1* | 12/2015 | Zenou | G03F 7/40 427/510 |
| 2016/0370316 | A1* | 12/2016 | Ndukaife | G02B 5/008 |

OTHER PUBLICATIONS

N. Sani et al: "All-printed diode operating at 1.6 GHz", Proceedings of the National Academy of Sciences, Bd. 111, Nr. 33, Jul. 7, 2014.

Bet S et al: "Thin film deposition on plastic substrates using silicon nanoparticles and laser nanoforming", Materials Science and Engineering B, Elsevier Sequoia, Lausanne, CH, Bd. 130, Nr. 1-3, Jun. 15, 2006.

Sandmann Alice et al: "Continuous wave ultraviolet-laser sintering of ZnO and TiOnanoparticle thin films at low laser powers", Journal of Applied Physics, American Institute of Physics, US, Bd. 113, Nr. 4, Jan. 28, 2013.

Ko Seung et al: "Air stable high resolution organic transistors by selective laser sintering of ink-jet printed metal nanoparticles", Applied Physics Letters, A I P Publishing LLC, US, Bd. 90, Nr. 14, Apr. 3, 2007.

* cited by examiner

METHOD FOR PRODUCTION OF COMPONENTS COMPRISING A SCHOTTKY DIODE BY MEANS OF PRINTING TECHNOLOGY

CROSS REFERENCE TO RELATED APPLICATIONS

This application is a national stage application under 35 U.S.C. 371 and claims the benefit of PCT Application No. PCT/EP2016/056315 having an international filing date of 23 Mar. 2016, which designated the United States, which PCT application claimed the benefit of German Patent Application No. 10 2015 205 230.3 filed 23 Mar. 2015, the disclosure of each of which are incorporated herein by reference.

The invention concerns a method for production of components comprising a Schottky diode by means of printing technology.

BACKGROUND OF THE INVENTION

Easily produced circuits are desirable for many electronic applications. The costs of the production are of great importance.

Existing techniques for the manufacture of such circuits have made it possible to produce many different structures.

Thus, for example, it is possible to produce circuits with the aid of Thin-film Organic and inorganic Large Area Electronic (TOLAE) techniques, but these structures are often inadequate in regard to their high-frequency properties, so that a use at high frequencies is often not possible. This is due to the fact, for example, that the process temperatures have to be kept relatively low, e.g., in order to obtain mechanically flexible substrates, and so the structural/electronic quality of the thin semiconductor films is poor as compared to classical semiconductor substrates or materials with high crystallinity.

In particular, the cost-effective production of thin-film Schottky diodes having corresponding high-frequency properties beyond 20 MHz of the typical diode characteristic has been extremely difficult thus far.

Given this situation, one problem which the invention proposes to solve is to provide a method for the production of components having a Schottky diode which makes it possible to produce the corresponding components with the corresponding high-frequency properties in a cost-effective manner.

The problem is solved by a method according to claim 1. Further advantageous embodiments are the subject matter in particular of the dependent claims. Moreover, the problem is solved by components according to claim 3 which are produced by one of the methods.

Figure 2:
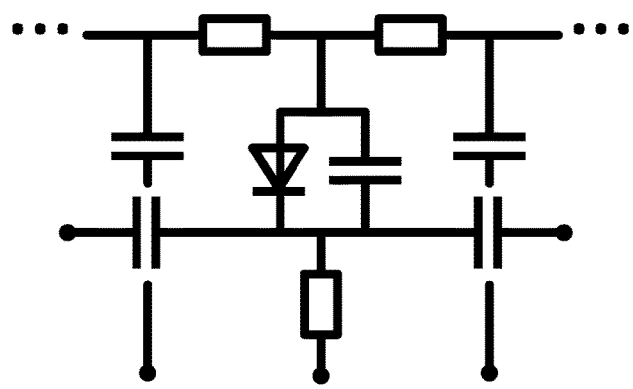
Figure 3:
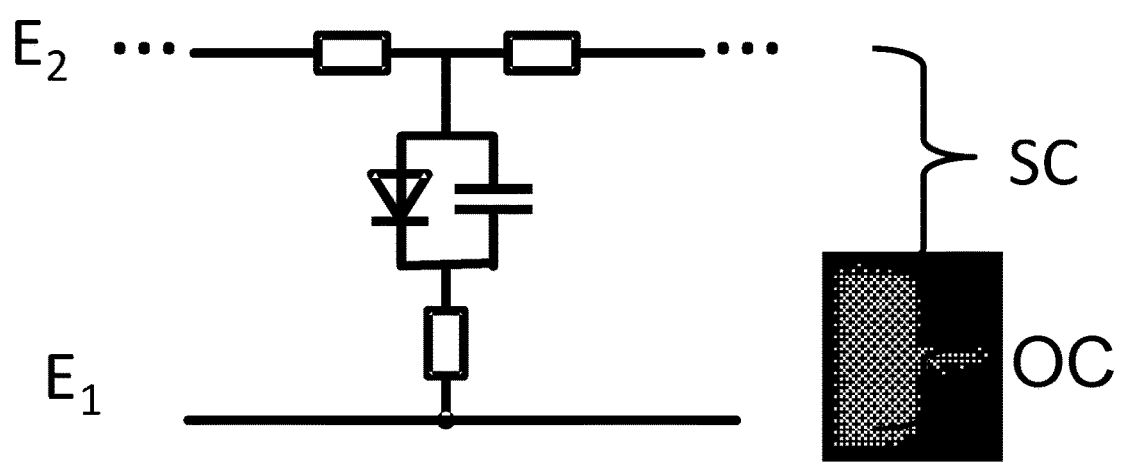
Figure 4:
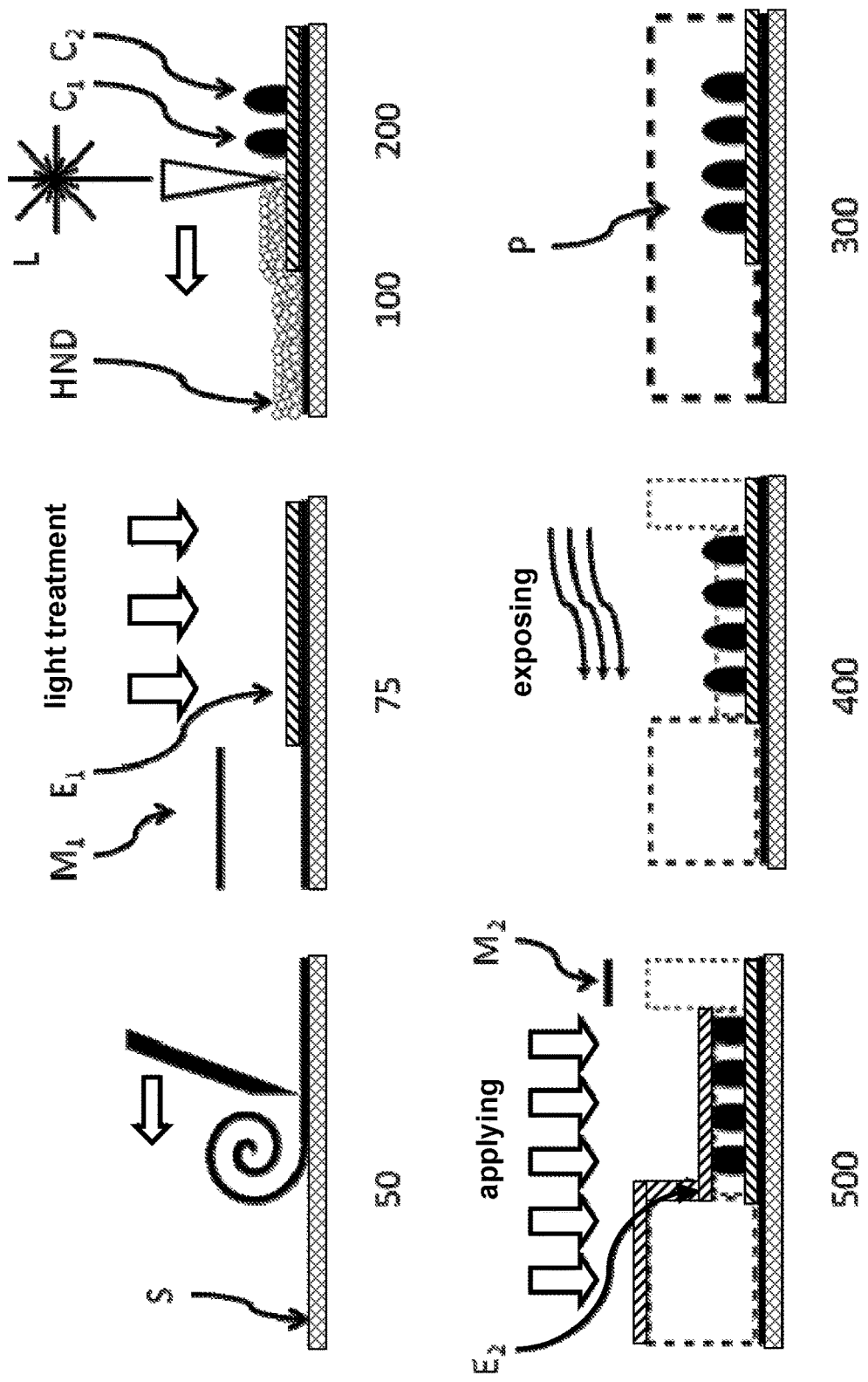

The invention shall be explained below with regard to the figures:

FIG. 1 shows a schematic cross section through sample components according to embodiments of the invention, FIG. 2 shows one possible equivalent electrical circuit corresponding to the schematic cross section of FIG. 1, FIG. 3 shows one possible equivalent electrical circuit corresponding to a mu-cone according to embodiments of the invention, FIG. 4 shows one sample overview of different work steps according to embodiments of the invention.

Insofar as reference is made below to particular reference symbols, these are generally meant to apply equally to all representations, unless otherwise specified.

Furthermore, insofar as hatchmarks or other graphical means are used in the figures, unless otherwise specified the same or an equivalent element is represented with the same hatchmarks or graphical means.

According to a method per the invention, components having a Schottky diode are produced by means of printing technology.

This makes use of a substrate S, as shown for example in FIG. 4. The substrate S may optionally be provided in advance in a step 50 with a bonding layer depending on its properties in regard to a bonding with a subsequently applied electrode $E_1$. Such techniques are known in the prior art and may involve for example the laminating of a heat-stable polymer substrate. Alternatively, however, step 50 may also be used to apply a polymer substrate as a self-standing substrate, which may be stripped off from the carrier substrate S after the processing according to the invention, e.g., in order to enable mechanically flexible circuits.

Next, in a further step 75, the electrode $E_1$ may be applied by means of known techniques. Such techniques are, for example, printing and/or PVD (Physical Vapor Deposition). The electrode $E_1$ may be formed by means of masks $M_1$ or afterwards by means of lithography. The semifinished part so obtained can then be further processed.

Now, in a step 100, a semiconductor-nanoparticle dispersion HND is applied to and deposited on the first electrode $E_1$. Doctor blade techniques, silk screen methods, ink jet printing, rotational coating and the like may be used, or the dispersion is poured out.

After this, laser light L is beamed onto the thin film obtained from the deposited semiconductor-nanoparticle dispersion HND in step 200 to form a mu-cone $C_1$ from the semiconductor-nanoparticle dispersion HND. The height and thickness of a mu-cone or a plurality of mu-cones can be adjusted, e.g., by the thickness of the thin film obtained from the semiconductor-nanoparticle dispersion HND, the energy/power density of the (pulsed) laser light L, the pulse frequency of the laser light L (if any), the scanning rate of the laser light L, the oxide fraction in the semiconductor-nanoparticle dispersion HND, or through the surface energy of the electrode $E_1$.

Advantageously, the electrode $E_1$ is designed so as to withstand a laser treatment. The intensity and application time of the laser light L are important, accordingly. Typically, the choice of material (melting point) as well as the design of the electrode (thickness, area, thermal capacity) itself can ensure that the material of the electrode $E_1$ withstands the laser treatment. Examples of electrode materials are titanium but also gold, silver, copper or aluminum.

Although in the following only one mu-cone shall be discussed, it is obvious to the person skilled in the art that a plurality of mu-cones $C_1, C_2, \ldots C_n$ may be produced in parallel and/or sequentially by means of one or more laser light sources L from the same deposited semiconductor-nanoparticle dispersion HND. Of course, a different semiconductor-nanoparticle dispersion HND may also be applied, from which mu-cones $C_{n+1}, C_{n+2}, \ldots C_{n+m}$ may be formed in turn. In this case, the previous thin film obtained from the semiconductor-nanoparticle dispersion HND that was not used for the forming of mu-cones $C_1, C_2, \ldots C_n$ can remain on the substrate S/electrode $E_1$ or be removed, depending on the application.

The removal of [a] deposited semiconductor-nanoparticle dispersion HND which was not used for the forming of mu-cones $C_1, C_2, \ldots C_n, C_{n+1}, C_{n+2}, \ldots C_{n+m}$ may involve a flow off and/or other cleaning steps, such as blow off, rinse off, undercut etching, etc.

Now one or more mu-cones $C_1, C_2, \ldots C_n, C_{n+1}, C_{n+2}, \ldots C_{n+m}$ are formed, each one having a bottom and a tip, wherein the bottom of a mu-cone $C_1, C_2, \ldots C_n, C_{n+1}, C_{n+2}, \ldots C_{n+m}$ is connected to the first electrode $E_1$.

In a further step 300, the mu-cone $C_1$ or the mu-cones $C_1, C_2, \ldots C_n, C_{n+1}, C_{n+2}, \ldots C_{n+m}$ so formed are embedded in an electrically insulating polymer matrix P.

The polymer matrix P may comprise at least one of the group of acrylic acid esters, polyurethanes, silicones or epoxy resins, such as polyimides, polycarbonates, and/or polyacrylates.

The polymer matrix P may be cross-linked or not. If a cross-linking is desired, e.g., on account of a better supporting effect, better stability, and/or better electrical properties (e.g., insulating properties), etc., the polymer matrix may be cross-linked by activation (e.g., by means of UV light or laser light L) or undergo excitation for the cross-linking.

Depending on the thickness of the polymer matrix P, it may optionally be necessary to re-expose the tips of the mu-cone $C_1$ or the mu-cones $C_1, C_2, \ldots C_n, C_{n+1}, C_{n+2}, \ldots C_{n+m}$ in a step 400. This may be done for example by means of suitable etching methods, such as Reactive Ion Etching (RIE) possibly with addition of suitable process gases, such as oxygen and/or $CF_4$ and/or $SF_6$.

Once the tips of the mu-cone $C_1$ of the mu-cones $C_1, C_2, \ldots C_n, C_{n+1}, C_{n+2}, \ldots C_{n+m}$ are exposed, a second electrode $E_2$ may be deposited in a further step 500, so that the tips of the mu-cone $C_1$ or the mu-cones $C_1, C_2, \ldots C_n, C_{n+1}, C_{n+2}, \ldots C_{n+m}$ are connected to the second electrode $E_2$.

Although only one second electrode $E_2$ is described above, of course this may also involve a plurality of electrodes just as with the first electrode $E_1$. For example, mu-cones which have been formed from a first semiconductor-nanoparticle dispersion HND may be connected to another electrode as mu-cones which have been formed from another semiconductor-nanoparticle dispersion HND.

The second electrode can be made of the most diverse materials. The methods of applying the second electrode may be correspondingly different as well.

Thus, the second electrode $E_2$ may likewise be applied by means of PVD methods and/or printing as described above in step 75.

Since the second electrode $E_2$ is generally no longer processed by laser, the range of possible materials is significantly larger. Thus, besides the classical metallic and metal oxide electrodes, one may also use electrically conductive polymers such as poly-3,4-ethylene dioxythiophene, doped polyacetylene, spiro, as well as graphene or fullerene.

Therefore, the Schottky barrier between the second electrode E2 and the mu-cone $C_1$ or the mu-cones $C_1, C_2, \ldots C_n, C_{n+1}, C_{n+2}, \ldots C_{n+m}$ can be influenced by means of suitable choice of material and processing method. This can be achieved, e.g., by targeted modification of the mu-cone tips (oxide/no oxide, lattice modifications, polymer functionalization).

Thus, e.g., a formation of oxide on the tips of the mu-cones can be encouraged, for example, by a (local) heat treatment in oxygen-rich atmosphere. Furthermore, it is possible to form oxide on the tips of the mu-cones simply by the fact that, for example, nanoparticles are already (partly) oxidized prior to the laser light exposure in step 200. But oxides can also be removed by treatment with HF (hydrofluoric acid) or the like. Lattice defects at the tips of the mu-cones may be introduced for example by means of sputter etching (ion etching).

Thus, with the methods of the invention as described above, components having a Schottky diode can be manufactured. The components comprise at least one mu-cone $C_1$; $C_2$ with a bottom and a tip, with the mu-cone $C_1$; $C_2$ comprising semiconductor material. The mu-cone $C_1$; $C_2$ is embedded in an electrically insulating polymer matrix P, while the bottom of the mu-cone $C_1$; $C_2$ is connected to a first electrode $E_1$ on the side of a substrate and the tip of the mu-cone $C_1$; $C_2$ is connected to a second electrode $E_2$. Either the first electrode $E_1$ or the second electrode $E_2$ forms a Schottky contact SC with the mu-cone $C_1$; $C_2$, while the respective other electrode $E_2$; $E_1$ forms a substantially ohmic contact OC.

Several such components are shown in cross section in FIG. 1. An equivalent electrical circuit is represented in FIG. 2.

In FIGS. 1, 2 and 3 it is assumed that the tip of the mu-cone $C_1$; $C_2$ forms a Schottky contact SC with the second electrode $E_2$ in each case, while the bottom of the mu-cone $C_1$; $C_2$ forms a substantially ohmic contact OC with the first electrode $E_1$. The equivalent electrical circuit of an individual mu-cone according to embodiments of the invention is represented in FIG. 3.

In particular, the invention makes it possible for the semiconductor in the semiconductor-nanoparticle dispersion HND to be of any given type of doping, e.g., p-doped, n-doped or even undoped.

Accordingly, as also described above, different semiconductor-nanoparticle dispersions HND with different dopings may be used in succession, as described above.

In particular, the semiconductor in the semiconductor-nanoparticle dispersion HND may comprise Si, Se, Ge or a III-V semiconductor, such as InP, GaAs, etc.

With the aid of the invention indicated above, it is possible in particular to process even flexible substrates S. Flexible substrates S may be, for example, polymer film, flexible printed circuit boards, paperlike materials, as well as textile substrates. But inflexible materials such as wafers may also be used as substrates S.

Thus, with the help of the invention, it is possible to produce components having a Schottky diode with cost-effective printable thin-film methods which have the required electrical properties of typical diode characteristics even in high-frequency applications. This is achieved in particular in that it is now possible to produce crystalline diodes with the aid of the technique of the invention. The term crystalline should not be understood in a limiting sense with regard to the invention, and it also encompasses poly-crystalline or microcrystalline mu-cones. Furthermore, the invention also makes possible the production of amorphous mu-cones in the same way.

In particular, Schottky diodes with typical diode characteristics not only at 20 MHz or more but also reaching into the GHz range (>1 GHz, especially 2 GHz, and preferably >10 GHz) can be realized in cost-effective manner by means of cost-effective techniques.

The invention claimed is:
1. A method for production of components comprising a Schottky diode by means of printing technology, comprising the steps:
application and deposition of a semiconductor-nanoparticle dispersion on a first electrode, which is disposed on a substrate, exposing the deposited semiconductor-nanoparticle dispersion to laser light to form a mu-cone with a bottom and a tip, wherein the bottom of the mu-cone is joined to the first electrode, embedding the thus-formed mu-cone in an electrically insulating polymer matrix, application of a second electrode, so that the tip of the mu-cone is joined to the second electrode.

2. The method according to claim 1, wherein before the application of the second electrode the tip of the mu-cone is etched clear.

3. A component having a Schottky diode comprising:

at least one mu-cone with a bottom and a tip, further wherein the mu-cone comprises a semiconductor material, further wherein the mu-cone is embedded in an electrically insulating polymer matrix, further wherein the bottom of the mu-cone is connected to a first electrode on the side of a substrate, and the tip of the mu-cone is connected to a second electrode, and further wherein either the first electrode or the second electrode forms a Schottky contact with the mu-cone, and the respective other electrode forms a substantially ohmic contact.

4. The component according to claim 3, wherein the semiconductor is p-doped.

5. The component according to claim 3, wherein the semiconductor is n-doped.

6. The component according to claim 3, wherein the semiconductor is undoped.

7. The component according to claim 3, wherein the semiconductor comprises Si, Se, Ge or a III-V semiconductor.

8. The component according to claim 3, wherein the polymer matrix comprises at least one of the group of acrylic acid esters, polyurethanes, silicones or epoxy resins, such as polyimides, polycarbonates, and/or polyacrylates.

9. The component according to claim 3, wherein the substrate is flexible.

* * * * *